(12) United States Patent
Rutkowski et al.

(10) Patent No.: US 8,629,581 B2
(45) Date of Patent: Jan. 14, 2014

(54) SYSTEM AND METHOD FOR COMMUNICATING NOTICE TO LIMIT DEGRADATION WITHIN A BATTERY PACK

(75) Inventors: Brian D. Rutkowski, Ypsilanti, MI (US); Brian C. Moorhead, Willis, MI (US); Paul W. Firehammer, Saline, MI (US); John W. Wagner, Ann Arbor, MI (US)

(73) Assignee: A123 Systems, Inc., Waltham, MA (US)

( * ) Notice: Subject to any disclaimer, the term of this patent is extended or adjusted under 35 U.S.C. 154(b) by 379 days.

(21) Appl. No.: 12/796,810

(22) Filed: Jun. 9, 2010

(65) Prior Publication Data

US 2010/0314950 A1    Dec. 16, 2010

Related U.S. Application Data

(60) Provisional application No. 61/185,774, filed on Jun. 10, 2009.

(51) Int. Cl.
*H01H 47/00* (2006.01)
*H01H 83/00* (2006.01)
*H02J 7/00* (2006.01)

(52) U.S. Cl.
USPC .......................................... 307/125; 307/150

(58) Field of Classification Search
USPC .................. 307/125, 150; 320/134
See application file for complete search history.

(56) References Cited

U.S. PATENT DOCUMENTS

| 6,184,656 B1 * | 2/2001 | Karunasiri et al. ........... 320/119 |
| 6,274,950 B1 * | 8/2001 | Gottlieb et al. ................. 307/66 |
| 2009/0206798 A1 * | 8/2009 | Choi et al. ..................... 320/150 |

FOREIGN PATENT DOCUMENTS

| KR | 20040000724 A | 1/2004 |
| KR | 20070025717 A | 3/2007 |
| KR | 20070076833 A | 7/2007 |
| KR | 20070100149 A | 10/2007 |
| KR | 20080067081 A | 7/2008 |
| KR | 20090014897 A | 2/2009 |

OTHER PUBLICATIONS

ISA Korean Intellectual Property Office, International Search Report of PCT/US2010/037895, Feb. 8, 2011, WIPO, 8 pages.

* cited by examiner

*Primary Examiner* — Carlos Amaya
(74) *Attorney, Agent, or Firm* — Alleman Hall McCoy Russell & Tuttle LLP

(57) ABSTRACT

Systems and methods for communicating notice to limit battery degradation within a battery pack are disclosed. In one example, a signal is generated and passed between modules of a battery pack to provide notice to limit battery pack degradation. The system and method may be particularly useful for a battery pack with distributed battery modules.

20 Claims, 7 Drawing Sheets

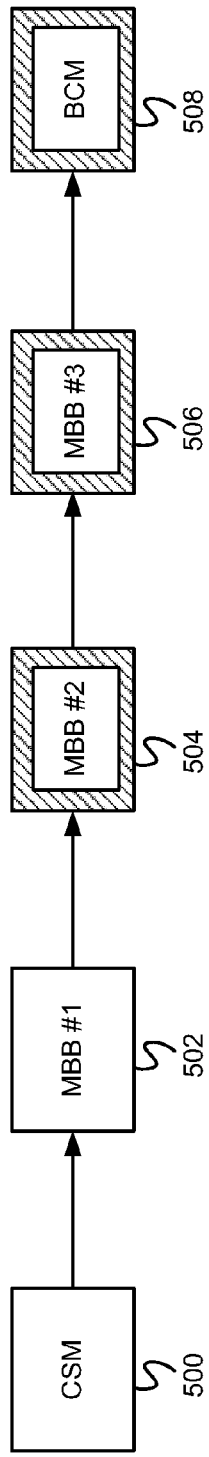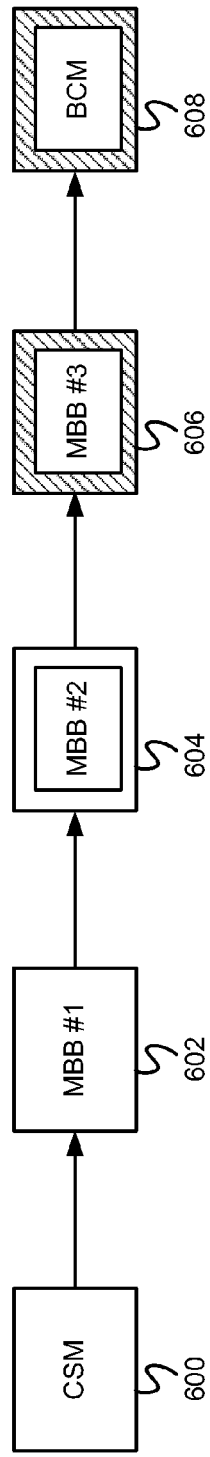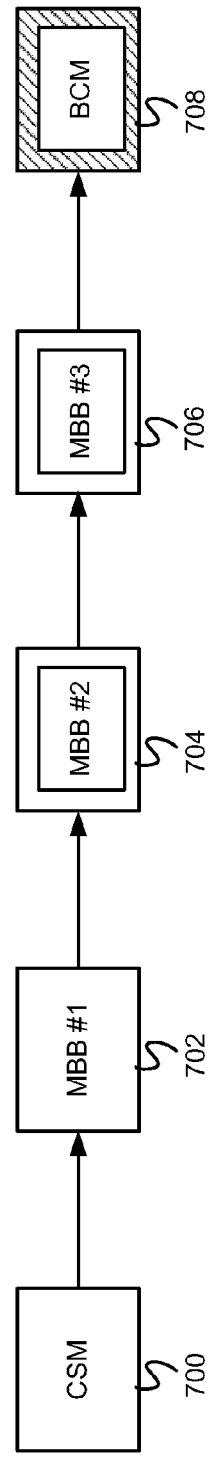

SYSTEM AND METHOD FOR COMMUNICATING NOTICE TO LIMIT DEGRADATION WITHIN A BATTERY PACK

CROSS REFERENCE TO RELATED APPLICATIONS

This application claims priority from U.S. Provisional Patent Application Ser. No. 61/185,774, filed Jun. 10, 2009 and entitled BATTERY NETWORK WITH HARDWARE WATCHDOG, the entirety of which is hereby incorporated herein by reference for all intents and purposes.

TECHNICAL FIELD

The present description relates to communicating notice to limit degradation within a battery pack. In one example, the battery pack provides power to a vehicle.

BACKGROUND AND SUMMARY

A battery pack may be configured with a plurality of electronic modules that perform different functions within a battery pack. Some modules may monitor and balance battery cells while other modules may supervise operations within the battery pack and communicate battery pack conditions to a controller that is external to the battery pack. A battery pack comprised of several modules and module types has several advantages over a battery pack that is configured with a single module that provides all battery functions. Specifically, a modular system allows a manufacturer to fabricate a range of battery packs that vary in physical dimensions and functional capability while selecting battery pack components from a limited group of components.

However, producing a battery pack with multiple modules may create other challenges. In particular, if one or more modules in a battery pack recognize a condition of degradation within the battery pack, it may take longer than desired to communicate the degraded condition to other battery pack modules. In addition, if a condition of degradation is broadcast over a communication link that transfers a variety of data between battery pack modules, the condition of degradation may not be communicated if there is a disruption in the communication system.

The inventors herein have recognized the above issues and developed an approach to address them. In one approach, a method for providing notice of degradation within a battery pack, comprising: coupling a plurality of battery modules via a communication link; generating a signal in a first battery pack module, the first battery pack module at a first end of the communication link; transmitting the signal via the communication link; and opening a battery output contactor in response to a lack of the signal at a second battery pack module at a second end of the communication link.

By electrically linking battery modules in a daisy-chain configuration, it is possible to transmit a heart beat signal from one end of the daisy-chain and to receive the signal at the other end of the daisy-chain. If a module located between the ends of the daisy-chained modules experiences a condition of degradation, the module can indicate the condition of degradation by interrupting the heart beat signal. A module at the receiving end of the daisy-chain can take mitigating actions when there is an absence of the signal. For example, the module at the end of the daisy-chain can open a battery output contactor if the heart beat signal is not present for a predetermined period of time. In this way, it is possible for a plurality of modules to indicate degradation within a battery pack without each module having to broadcast the signal of degradation.

The present description may provide several advantages. In particular, the approach can reduce system complexity by providing a single daisy chain link between battery pack modules. Further, the approach can communicate a condition of degradation quickly by simply interrupting a heartbeat signal anywhere along the electrical coupling. The modules do not have to compete for priority on a communication link to indicate a condition of degradation. In addition, if there is a disruption in the electrical coupling, the system can indicate a condition of degradation since interrupting the heart beat signal indicates a condition of degradation.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIG. 5 shows an example of module states for an initial step of a module programming sequence;

FIG. 6 shows an example of module states for a second step of a module programming sequence;

FIG. 7 shows an example of module states for a third step of a module programming sequence;

DETAILED DESCRIPTION OF THE DEPICTED EMBODIMENTS

Figure 1:
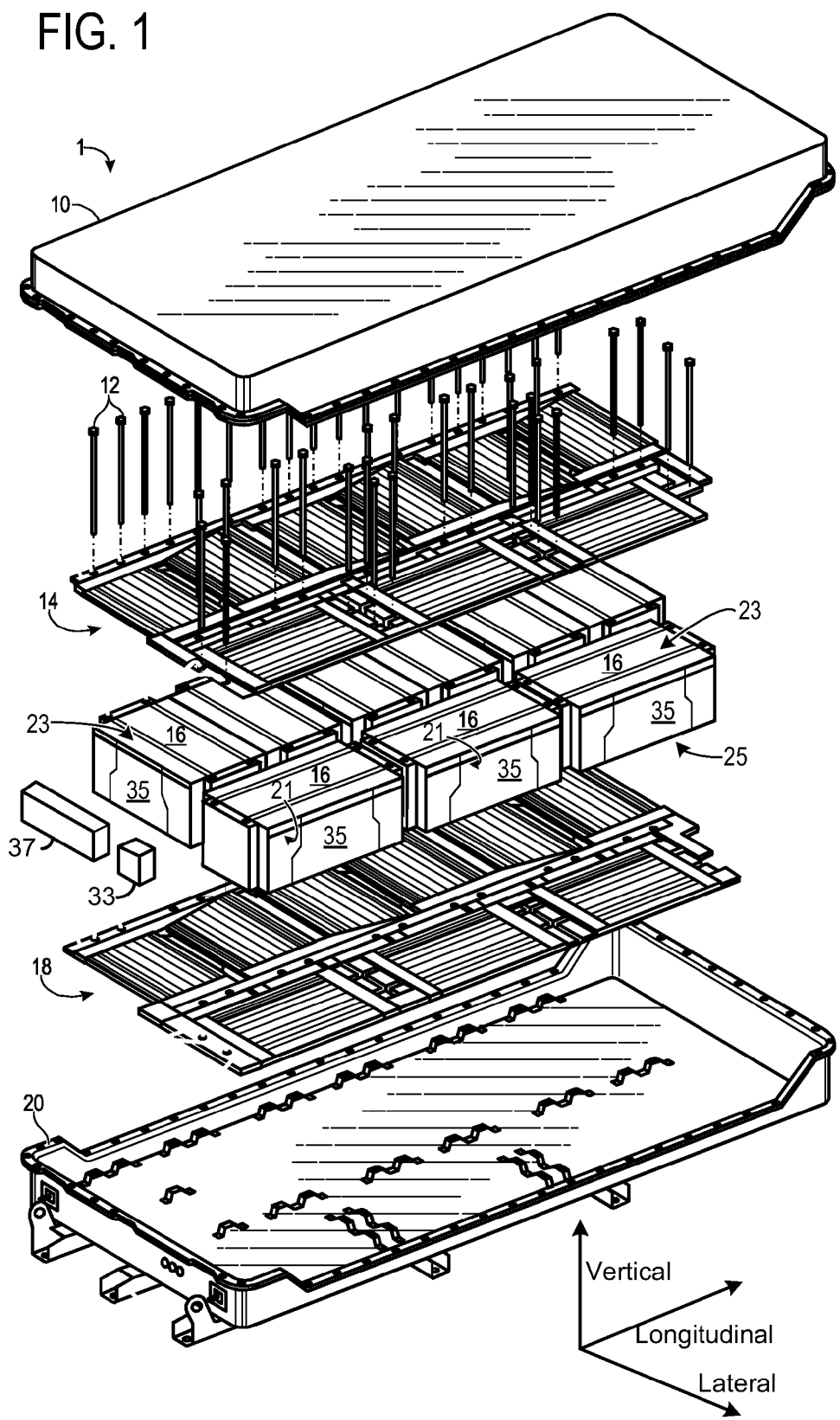
FIG. 1 shows an exploded schematic view of a battery pack or assembly.
Figure 8:
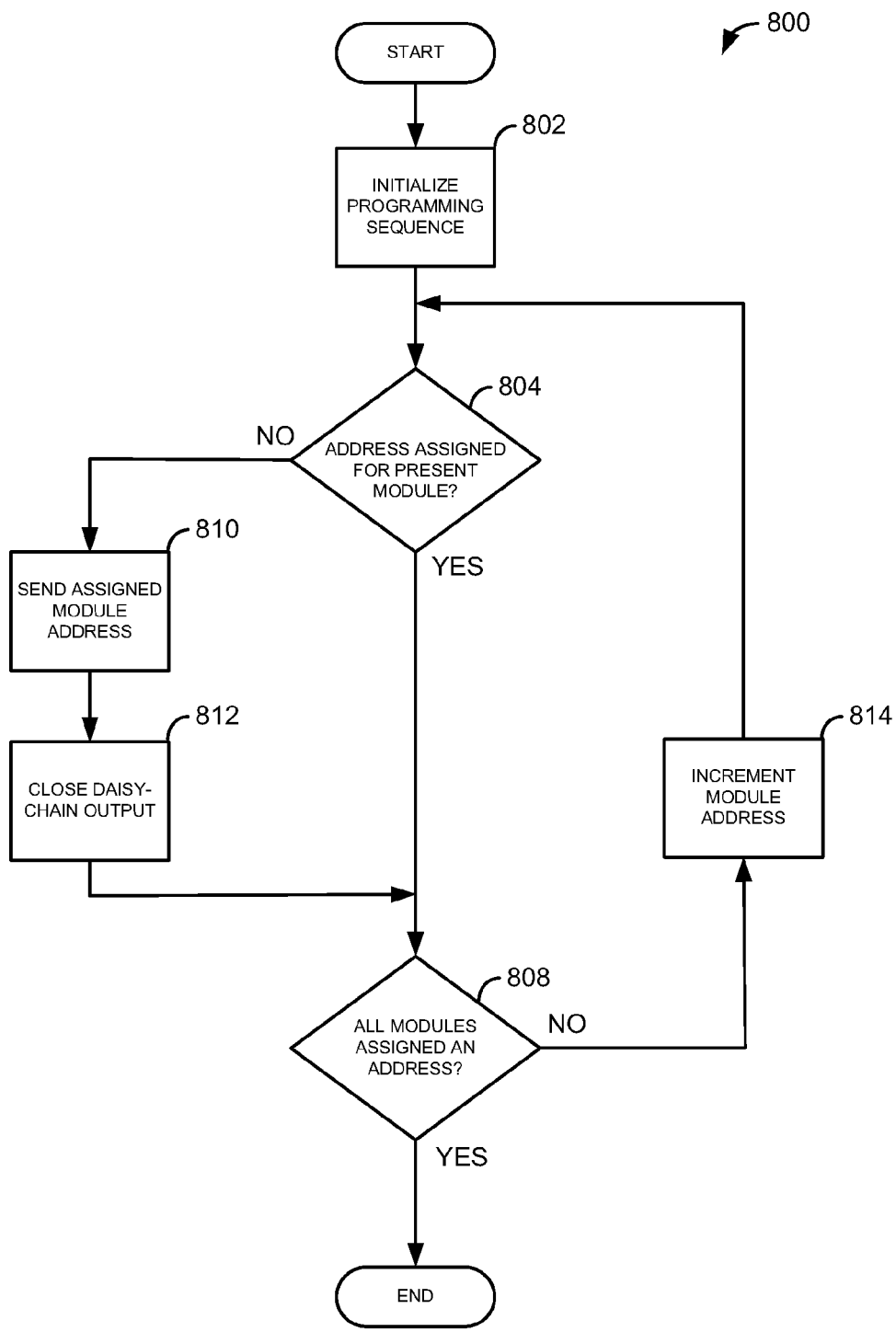
FIG. 8 shows a flowchart of a method for assigning addresses to battery pack modules.

The present description is related to providing notice to limit degradation within a battery pack. In one embodiment, battery cells such as those illustrated in FIGS. 2-3 may be combined in a battery pack as illustrated in FIG. 1. The power from the battery cells of FIGS. 1-3 may be selectively delivered to a load external to the battery pack via a contactor as shown in FIG. 4. In one example illustrated by the methods of FIGS. 9-10, a communication link within a battery pack provides notice within the battery pack to limit degradation within the battery pack. In the method of FIG. 8 the communication link provides an ancillary function for assigning addresses to battery pack modules.

FIG. 1 shows an exploded view of a battery assembly 1. The battery assembly may include a cover 10, coupling devices 12, a first cooling subsystem 14 (e.g., cold plate), a plurality of battery cell modules 16, a second cooling subsystem 18 (e.g., cold plate), and a tray 20. The cover may be attached to the tray via a suitable coupling device (e.g., bolts, adhesive, etc.,) to form a housing surrounding the coupling devices, the cooling subsystems, and the battery modules, when assembled.

The battery cell modules 16 may include a plurality of battery cells configured to store energy. Although a plurality of battery modules are illustrated, it will be appreciated that in other examples a single battery module may be utilized. Battery cell modules 16 may be interposed between the first cooling subsystem 14 and the second cooling subsystem 18, where the battery modules are positioned with their electrical terminals on a side 21 facing out between the cooling subsystems.

Each battery module may include a first side 23 and a second side 25. The first and the second side may be referred to as the top and bottom side, respectively. The top and bottom sides may flank the electrical terminals, discussed in greater detail herein with regard to FIGS. 2-3. In this example, the top side of each battery module is positioned in a common plane in the battery assembly. Likewise, the bottom side of each battery module is positioned in another common plane in the battery assembly. However, in other examples only the top side or the bottom side of each battery module may be positioned in a common plane. In this way, the cooling subsystems may maintain direct contact with the top sides and the bottom sides of the battery modules to increase heat transfer and improve cooling capacity, as described in further detail herein, wherein the cooling subsystems and the battery modules may be in face-sharing contact. Additional details of an exemplary battery module are described herein with regard to FIGS. 2-3. In alternate examples, only one of the cooling subsystems may be included in battery assembly 1, such as an upper cooling subsystem (subsystem 14 in this example). Moreover, the position, size, and geometry of the first and second cooling subsystems are exemplary in nature. Thus, the position, size, and/or geometry of the first and/or second cooling subsystems may be altered in other examples based on various design parameters of the battery assembly.

Battery assembly 1 may also include an electrical distribution module 33 (EDM), monitor and balance boards 35 (MBB), and a battery control module 37 (BCM). Voltage of battery cells in battery cell modules 16 may be monitored and balanced by MBBs that are integrated onto battery cell modules 16. Balancing battery cells refers to equalizing voltages between a plurality of battery cells in a battery cell stack. Further, battery cell voltages between battery cell stacks can be equalized. MBBs may include a plurality of current, voltage, and other sensors. The EDM controls the distribution of power from the battery pack to the battery load. In particular, the EDM contains contactors for coupling high voltage battery power to an external battery load such as an inverter. The BCM provides supervisory control over battery pack systems. For example, the BCM may control ancillary modules within the battery pack such as the EDM and cell MBB. Further, the BCM may be comprised of a microprocessor having random access memory, read only memory, input ports, real time clock, output ports, and a controller area network (CAN) port for communicating to systems outside of the battery pack as well as to MBBs and other battery pack modules.

Figure 2:
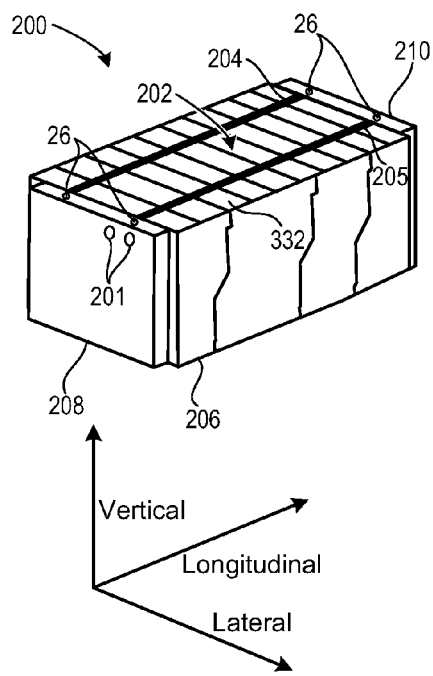
FIG. 2 shows a schematic view of an exemplary battery module.

FIG. 2 shows an exemplary battery module 200 that may be included in the plurality of battery cell modules 16, shown in FIG. 1. Battery module 200 may include a battery cell stack having a plurality of stacked battery cells and output terminals 201. The stacked arrangement allows the battery cells to be densely packed in the battery module.

Figure 3:
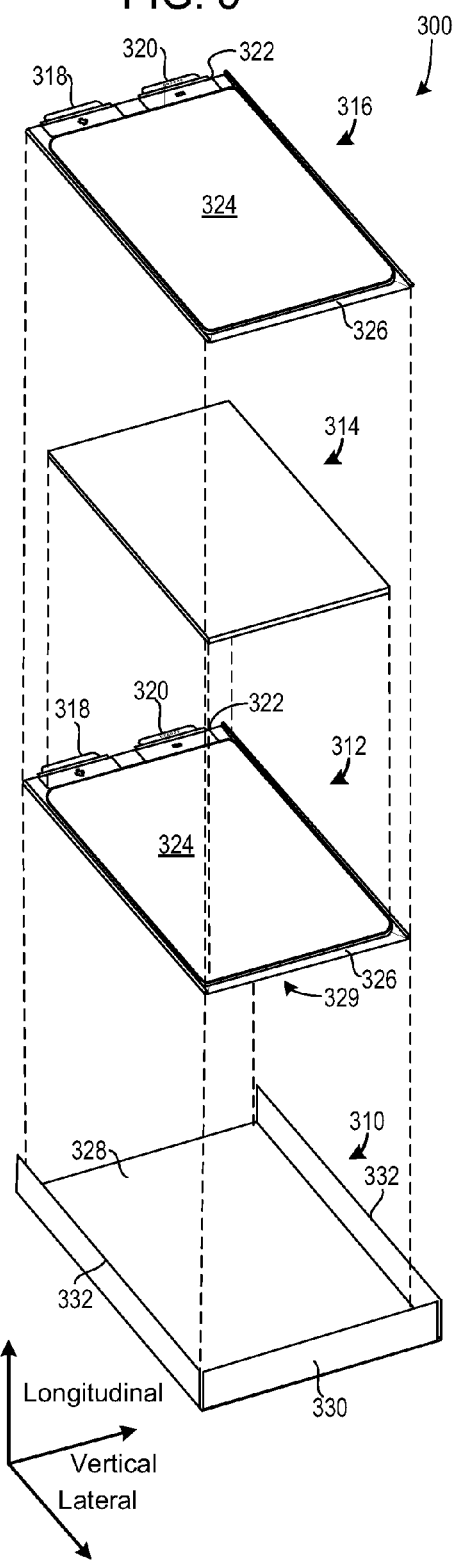
FIG. 3 shows an exploded schematic view of an exemplary battery cell stack.
Figure 4:
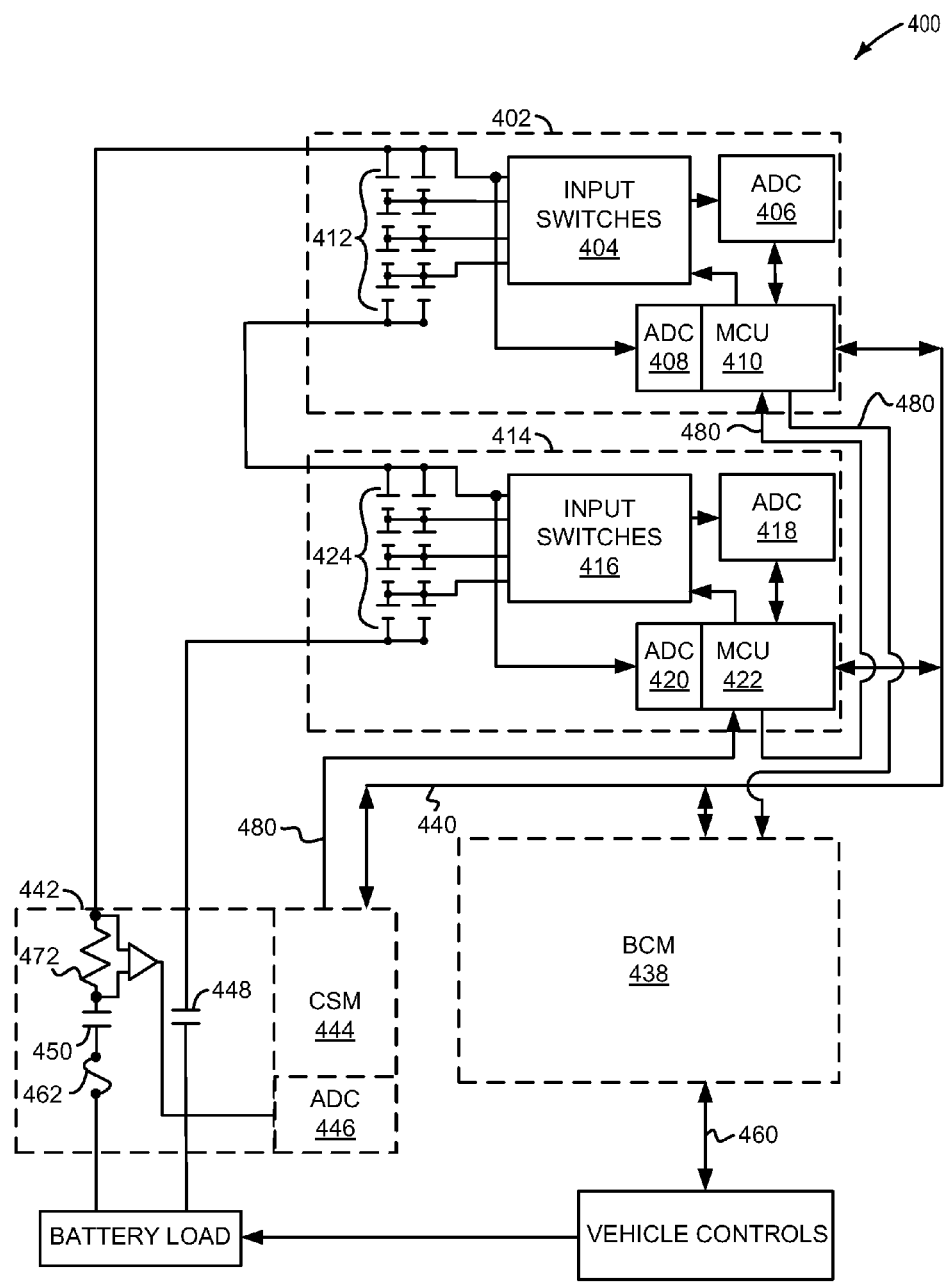
FIG. 4 shows an electrical schematic diagram for a battery pack.

FIG. 3 shows an exploded view of a portion of an exemplary battery cell stack 300. As shown the battery cell stack is built in the order of a housing heat sink 310, battery cell 312, compliant pad 314, battery cell 316, and so on. However, it will be appreciated that other arrangement are possible. For example, the battery cell stack may be built in the order of a housing heat sink, battery cell, housing heat sink, etc. Further in some examples, the housing heat sink may be integrated into the battery cells.

Battery cell 312 includes cathode 318 and anode 320 for connecting to a bus bar (not shown). The bus bar routes charge from one batter cell to another. A battery module may be configured with battery cells that are coupled in series and/or parallel. Bus bars couple like battery cell terminals when the battery cells are combined in parallel. For example, the positive terminal of a first battery cell is coupled to the positive terminal of a second battery cell to combine the battery cells in parallel. Bus bars also couple positive and negative terminal of battery cell terminals when it is desirable to increase the voltage of a battery module. Battery cell 312 further includes prismatic cell 324 that contains electrolytic compounds. Prismatic cell 324 is in thermal communication with cell heat sink 326. Cell heat sink 326 may be formed of a metal plate with the edges bent up 90 degrees on one or more sides to form a flanged edge. In the example of FIG. 3, two opposing sides include a flanged edge. However, other geometries are possible. Battery cell 312 is substantially identical to battery cell 316. Therefore similar parts are labeled accordingly. Battery cells 312 and 316 are arranged with their terminals in alignment and exposed. In battery module 200 shown in FIG. 2 the electric terminals are coupled to enable energy to be extracted from each cell in the battery module. Returning to FIG. 3, compliant pad 314 is interposed between battery cell 312 and battery cell 316. However, in other examples the compliant pad may not be included in the battery cell stack.

Housing heat sink 310 may be formed by a metal plate having a base 328 with the edges bent up 90 degrees on one or more sides to form a flanged edge. In FIG. 3 longitudinally aligned edge 330 and vertically aligned edges 332 are bent flanged edges. As depicted, the housing heat sink is sized to receive one or more battery cells. In other words, one or more battery cells may be positioned within base 328. Thus, the flanged edges of the battery cells may be in contact with housing heat sink and underside 329 of battery cell 312 may be in contact with the base of the housing heat sink, facilitating heat transfer.

One of the longitudinally aligned edges 332 of the housing heat sink 310 may form a portion of the top side 202 of battery module 200, as shown in FIG. 2. Similarly, one of the longitudinally aligned edges 332 may form a portion of the bottom side of the battery module. Thus, the longitudinally aligned edges of the housing heat sink may be in contact with the first and the second cooling subsystems to improve heat transfer. In this way, heat may be transferred from the battery cells to the exterior of the battery module.

The battery cells may be strapped together by binding bands 204 and 205. The binding bands may be wrapped around the battery cell stack or may simply extend from the front of the battery cell stack to the back of the battery cell stack. In the latter example, the binding bands may be coupled to a battery cover. In other embodiments, the binding bands may be comprised of threaded studs (e.g., metal threaded studs) that are bolted at the ends. Further, various other approaches may be used to bind the cells together into the stack. For example, threaded rods connected to end plates may be used to provide the desired compression. In another example, the cells may be stacked in a rigid frame with a plate on one end that could slide back and forth against the cells to provide the desired compressive force. In yet other embodiments, rods held in place by cotter pins may be used to secure the battery cells in place. Thus, it should be understood that various binding mechanisms may be used to hold the cell stack together, and the application is not limited to metal or plastic bands. Cover 206 provides protection for battery bus bars (not shown) that route charge from the plurality of battery cells to output terminals of the battery module.

The battery module may also include a front end cover 208 and a rear end cover 210 coupled to the battery cell stack. The front and rear end covers include module openings 26. However, in other examples the module openings may be included in a portion of the battery module containing battery cells.

Various methods are available to determine battery state of charge. By knowing the state of charge of a battery cell it is possible to determine whether or not the battery cell may accept additional charge. Further, by knowing the state of charge of a battery cell it is possible to determine when it is undesirable to further discharge a battery cell. One method of determining battery state of charge includes determining battery cell voltage.

Referring now to FIG. 4, a schematic diagram for controlling battery pack output is shown. In this example, battery pack 400 includes two battery cell modules 402 and 414 as indicated by the dashed lines. Further, current sense module 444 and battery control module 438 are shown.

Battery cells 412 and 424 are shown identically configured and are connected in series. However, battery cell modules may be configured with different numbers of battery cells, and the battery cells may be configured differently if desired. For example, battery cells 412 and 424 are comprised of eight battery cells each. Four of the battery cells are arranged in series. Further, the four battery cells are arranged in parallel with four other battery cells that are arranged in series. In this configuration, each battery module 402 and 414 outputs a voltage that is related to the number of battery cells connected in series as well as the individual voltage output of each battery cell. And, as discussed above, the current capacity or amp-hour rating of the battery module may be related to the number of battery cells connected in parallel. As the number of battery cells arranged in parallel increases, the battery module amp-hour rating increases. As the number of battery cells arranged in series increases, the output voltage of the battery module increases. Thus, the voltage output of a battery pack can be increased or decreased by changing the number of battery cells arranged in a series connection. Likewise, the battery pack amp-hour rating may be increased or decreased by changing the number of battery cells arranged in parallel. Therefore, in this example, the battery pack voltage may be increased by adding additional battery cells in series with the battery cells of battery cell modules 402 and 414. Alternatively, the battery module amp-hour rating may be increased by adding more battery cells in parallel to battery cells 412 and 524.

Battery cell modules 402 may be configured to include a high voltage bus and a low voltage bus. The high voltage bus may be isolated from the low voltage bus to reduce ground loops and electrical noise within the battery pack. The battery cells and power electronics can be included on a portion of the battery cell module 402 that are in communication with the high voltage bus. Low level electronics are in communication with the low voltage bus.

Battery cell modules 402 and 414 include input switches 404 and 416 for selectively coupling ADCs 406 and 418 to battery cells 412 and 424 respectively. MCUs 410 and 422 control the state of switches 404 and 416 by way of digital outputs from the respective MCUs. Input switches 404 and 416 are configured such that ADCs 406 and 418 may be coupled to individual battery cells to measure battery cell voltage without being influenced by the voltage of battery cells that may be placed in series with the battery cell being measured. In one embodiment, each MCU 410 and 422 may couple each series connected battery cell to respective ADCs 406 and 418. When battery cells are coupled in parallel, input switches 404 and 416 couple ADCs 406 and 418 to the battery cells of a battery module that are coupled in parallel. Thus, each ADC coupled to a battery cell stack may be configured to measure the voltage of one or more battery cells coupled in parallel within the respective battery cell stack.

ADCs 406 and 418 are configured as high resolution (e.g., 12 or 16 bit resolution ADCs) devices that are external or off chip from MCUs 410 and 418 although ADCs may be on chip in other embodiments and may have different resolutions (e.g., 8 bit resolution). In one example, ADCs 406 and 418 communicate with MCUs 410 and 422 respectively by way of SPI ports. The SPI ports are used to transfer battery cell voltages to each MCU as the individual MCUs command input switches 404 and 416 to cycle through battery cells 412 and 424 respectively. By cycling through the switches, individual series battery cells are coupled to ADCs 406 and 418 for determining battery cell voltages.

ADCs 408 and 420 are lower resolution (e.g., 8 bit resolution) devices that are integrated to MCUs 410 and 422. In alternate embodiments, ADCs 408 and 420 may be of higher resolution (e.g., 12 or 16 bit resolution) and external from MCUs 410 and 422. ADCs 408 and 420 are configured to measure the series voltage provided by battery cells 412 and 424 for the respective battery cell stacks 402 and 414. For example, ADC 408 is configured to measure the voltage provided by the series combination of four battery cells coupled in parallel to four other battery cells, the battery cells indicated at 412. Thus, the ADC of an MBB is configured to measure the series combination of battery cells of a battery module. Of course, an ADC of a MBB coupled to a battery module may be configured to measure the voltage of additional or fewer battery cells than the four battery cells shown in FIG. 4. Further, as discussed above, the series combination of battery cells 412 acts to increase the output voltage of the battery module 402.

MCUs 410 and 422 control input switches 404 and 416 as well as ADCs 406 and 408, 418, and 420. Further, MCUs 410 and 422 may store the respective battery voltages to memory and perform arithmetic and logical operations on battery voltage data captured by ADCs 406, 408, 418, and 420.

Battery cell modules 402 and 414 are assigned numbers according to the position of each module relative to the high voltage bus. In particular, the battery cell module that has a terminal with the lowest electrical potential of the high voltage bus is numbered as module number 1. The battery cell module that has a terminal with the next lowest electrical potential of the high voltage bus is numbered as module number 2, and so on until the highest potential battery cell module is numbered. Thus, in a system with six battery cell modules, the modules are numbered 1-6. However, is should be noted that battery cell modules do not have to be positioned within the battery pack according to how the battery cell modules are numbers since packaging constraints may dictate otherwise. For example, in a battery pack with four battery cell modules, the battery cell module identified as module 1 may be positioned near battery cell module 2, and battery cell module 2 may be positioned near battery cell module 4, and battery cell module 4 may be positioned near battery cell module 3.

Battery pack 400 also includes a communication link 480 for providing notice to limit degradation within the battery pack. In one example, the communication link 480 may be a comprised of a series of single electrical conductors extending from one battery pack module to other battery pack modules. In another example, the communication link 480 may be an optical communication link.

Communication link 480 begins at CSM 444 and then proceeds to battery cell module 414. Communication link 480 then continues to battery cell module 402 before terminating at BCM 438. Thus, communication link 480 moves from one battery module to the next battery module connecting the battery modules in a daisy-chain one module after the other configuration. Communication link 480 may be routed between modules in a different order than is shown in FIG. 4. In particular, communication link 480 may be routed between battery modules in an order that is most efficient to physically connect the modules. In one example, the CSM is placed at one end of the daisy-chain and the BCM is positioned at the other end of the daisy-chain.

A signal is generated at one end of communication link 480 (e.g., at CSM 444) and is sensed at the other end of the link (e.g., at BCM 438). Any module from one end (e.g., CSM 44) of communication link 480 to the other end (e.g., BCM 438) of communication link 480 can indicate a condition of degradation within the module by interrupting the signal along communication link 480. In one example, the signal may be interrupted by setting a transistor or switch to an open state, thereby interrupting the transfer of the signal along communication link 480. If the signal is interrupted for a time greater than a predetermined amount of time, BCM 438 opens contactors 450 and 448. In other configurations, BCM 438 opens a contactor that has a current limiting resistor in series with the contactor that is opened. In still other configurations, BCM 438 can open two contactors that are on the high potential side of battery cells 412 and 424.

In one example, each module has an input and output for communication link 480. The purpose of the line can be described by the following: LINK_OUT=(LINK_IN OR MICRO_INTERRUPT OR CELL_THRESHOLD), where LINK_OUT indicates a request to communicate notice to limit battery pack degradation, LINK_IN is asserted when the communication link from a previous electronic module communicating a notice to limit battery pack degradation, MICRO_INTERRUPT is asserted when a module microcontroller wishes to communicate a condition to limit battery pack degradation or an absence of an address, and CELL_THRESHOLD is asserted when a battery cell voltage is greater or less than a specified battery cell voltage range. The input side includes a current limiting resistor and light emitting diode for optically coupling the low voltage bus to the high voltage bus. The resistor is connected to the low voltage bus power supply on one side and the anode of the light emitting diode on the other side. The light emitting diode activates a transistor on the output side of the optical coupler when the cathode of the light emitting diode that is connected to LINK_IN is pulled to ground. The light emitting diode is deactivated when LINK_IN is allowed to float. The emitter output of the input optical coupler is in communication with a NAND gate. The NAND gate has three inputs. The first input is from the output of the input optical coupler (LINK_IN) while the second input is driven by a microcontroller output (MICRO_INTERRUPT) and the third is from a hardware voltage detection circuit (CELL_THRESHOLD). The NAND gate drives the cathode side of the output optical coupler. The output optical coupler is activated when the NAND gate is in a low states since the anode of the output optical coupler is tied to 5 volts through a pull-up resistor. The optical couplers isolate the low voltage bus from the high voltage bus. When the input side is driven to a low state the input optical coupler is activated and the first input of the NAND gate is to a high level. If the microcontroller is not driving the second NAND input low and the hardware voltage circuit is not driving the third NAND input low, the output optical cathode is driven low thereby activating the output optical coupler and causing its emitter output to be driven low. A link output driven low is an indication to the input of another module that there is no degradation present at any of the pervious modules. In the first module of the battery modules that are daisy-chained together the input to the optical coupler is tied low so that the first module's input optical coupler is in a state that permits the transmission of the heartbeat signal to the immediate following module in the daisy-chain of battery modules. The first module provides the heartbeat signal by toggling the input of the NAND gate with a microcontroller. In one example, the optical coupler is driven by a 1 Hz signal with a 100 ms high-time and 900 ms low-time.

Communication link 480 also functions as part of the module programming system. In particular, the input optical coupler for each module along the length of communication link 480 is an input for determining whether or not to accept an address assignment from BCM 438 via CAN link 440. Modules are configured to accept an address assignment only when the optical input is asserted (e.g., driven low) and when the module presently has no assigned address.

BCM 438 communicates with MCUs 410 and 422 of battery cell modules 402 and 414 by way of CAN bus 440; however, other types of communication links are also possible and anticipated. BCM 438 may acquire battery voltages and status indicators (e.g., flags that indicate degradation of an ADC, battery cell, or MCU) from battery cell modules 402 and 414. BCM 438 also communicates with EDM 442 via hardwired digital inputs and outputs for opening and closing contactors 450 and 448. In an alternative embodiment, BCM 438 may communicate to EDM 442 via CAN 440 for sending instructions to close contactors 450 and 448 when it is determined to couple battery cell stacks 402 and 414 to the battery load or source. Contactors 450 and 448 act as electrically controlled switches and do not interrupt short circuit current without instruction from BCM 438. In one example, contactors 450 and 448 are normally open and include a closing coil and metallic contacts that may be engaged and disengaged with metallic current carrying conductors by operating the closing coil. In one example, the contactors open by physically moving apart. In other examples where less power is provided by the battery pack, the output contactor may be a silicon based contactor such as a FET or bi-polar transistor, for example.

CSM 444 includes an ADC 446 for measuring battery pack current on the battery side of contactors 450 and 448. Current shunt 472 provides a voltage that is proportional to current flow entering or exiting the battery pack to a microcontroller within CSM 444. The CSM microcontroller converts battery pack current into digital data via ADC 446. The CSM microcontroller transmits current data to BCM 438 via CAN bus 440. BCM 438 also communicates with a vehicle controller via CAN bus 460. BCM 438 may communicate a variety of battery related information to a vehicle controller via CAN bus 460. For example, BCM 438 can send an indication of available battery current capacity and/or an indication of battery current sinking or sourcing capacity. Fuse 462 provides current limiting protection to the battery pack.

Thus, the system of FIG. 4 provides for a system for assigning address to a plurality of battery pack electronic modules, comprising: a first communication link; a second communication link; and a controller, said controller including instructions for accepting an address assignment for a battery pack electronic module in response to a signal from said first communication link, an absence of an address assignment, and an address broadcast over said second communication link. The system also includes where said signal from said first communication link is a signal providing no notice of a request to limit battery pack degradation, and wherein said address is broadcast by a battery control module within said battery pack. In one example, the system further comprises an output circuit of a battery pack module of said plurality of battery pack modules, said output circuit configured to indicate notice of a request to limit battery pack degradation. The system also includes where said second communication link is a CAN link and wherein said address assignment broadcast on said second communication link is broadcast via a BCM.

Further, the system of FIG. 4 provides for a system for providing notice to limit degradation within a battery pack, comprising: a first module of a plurality of electronic modules in a battery pack, the first module including a signal generator configured to generate a signal; a second module of the plurality of electronic modules in the battery pack, the second module configured to monitor at least one battery cell, the second module further configured to pass and interrupt the signal; a third module of the plurality of electronic modules in the battery pack, the third module including a signal receiver, the signal receiver configured to receive the signal, the third module further including an output for controlling an output contactor of the battery pack. The system also includes where the second module is configured to interrupt the signal during a condition of degradation recognized by the second module, and wherein the third module of the plurality of electronic modules includes hardware circuitry for controlling the output contactor. The system further includes where the second module is configured to pass the signal during an absence of a condition of degradation recognized by the second module. The system further includes where the third module includes a controller having instructions for assigning addresses to modules in the plurality of electronic modules. In one example, the system includes where the third module is a battery pack controller module configured to communicate a condition of battery pack degradation to a controller external to the battery pack when the signal is interrupted by the second module of the plurality of electronic modules in the battery pack. In another example, the system includes where the first module, the second module, and the third module are in communication via a daisy-chained communication link. The system also provides for where the daisy-chained communication link is in communication with a low voltage bus in the battery pack.

The system of FIG. 4 also provides for a system for providing notice to limit degradation within a battery pack, comprising: a signal generator configured to generate a signal; a first circuit for detecting a threshold condition of a battery pack, the circuit also configured to pass and interrupt the signal; and a second circuit, the second circuit configured to open an output contactor of the battery pack in response to an absence of the signal at the second circuit for more than a predetermined amount of time. The system also includes where the signal generator is coupled to the second circuit via a communication link, and wherein the system further includes a controller for communicating a request to limit battery pack degradation to a controller external the battery pack. The system includes where the first circuit is one of a plurality of circuits for detecting the threshold condition of a plurality of electronic modules, and wherein the communication link is arranged in a daisy-chain configuration between the plurality of electronic modules. The system includes where the controller includes further instructions for assigning addresses to the plurality of electronic modules. The system also includes where each of said plurality of electronic modules is assigned a unique address. The system also provides for where the assigning of addresses is carried out at one address at a time for the plurality of electronic modules.

Referring now to FIG. 5, example of module states for an initial step of a module programming sequence is shown. The programming sequence applies for a system as shown in FIG. 4 at 480 that uses a communication link for providing notice to limit battery pack degradation as a way to program battery modules. Representations for five modules are labeled at 500-508. The first module in the string is CSM 500, followed by MBBs (1-3) 502-506, and finally by the BCM 508. The modules are coupled by the communication link in a daisy-chain configuration.

Module programming is initiated by deactivating the heartbeat signal and clearing the module address from each module. Clearing the module addresses causes the output optical couplers of the communication link for providing notice to limit battery pack degradation to float so that the optical inputs of subsequent modules are in a high state. Transmission of signals down the communication link is inhibited while the daisy-chain inputs are in a high state.

In FIG. 5, modules with an input set to a high state are indicated with cross hatching as at 504-508. When an input of a module is set high, the module will not accept an address assignment from the BCM. The output optical coupler of CSM 500 is driven to a low state continuously since the heartbeat address was cleared prior to programming, thereby readying MBB #1 for accepting an address. BCM 508 sends addressing commands to the MBB modules 502-506 starting with an address of number one and increments until all MBBs are assigned addresses.

Referring now to FIG. 6, an example of module states for a second step of module programming sequence is shown. Similar to FIG. 5, representations for five modules are labeled at 600-608. The first module in the string is CSM 600, followed by MBBs (1-3) 602-606, and finally by the BCM 608.

At the second step of address programming, MBB number one accepts address number one via the CAN bus. MBB number one accepts address number one when the communication link input of MBB number one is asserted low, and when the address of MBB number one has been cleared. After the address is accepted, the output of MBB number one is asserted low, thereby setting up MBB number two for address programming. Again like FIG. 5, modules with an input set to a high state are indicated with cross hatching as at 606-608. As described above, when an input of a module is set high, the module will not accept an address assignment from the BCM.

Referring now to FIG. 7, an example of module states for a third step of a module programming sequence is shown. Similar to FIGS. 5-6, representations for five modules are labeled at 700-708. The first module in the string is CSM 700, followed by MBBs (1-3) 702-706, and finally by the BCM 708.

At the third step of address programming, MBB number two accepts address number two via the CAN bus. MBB number two accepts address number two when the communication link input of MBB number two is asserted low, and when the address of MBB number two has been cleared. After the address is accepted, the output of MBB number two is asserted low, thereby setting up MBB number three for address programming. Again like FIGS. 5-6, modules with an input set to a high state are indicated with cross hatching as at 708. As described above, when an input of a module is set high, the module will not accept an address assignment from the BCM 708.

Thus in a first mode, module programming is facilitated by the communication link that is for providing a notice to limit degradation. Once programming of each MBB is accomplished, the BCM 708 input is asserted low and the communication link is prepared to transmit the heartbeat signal from the CSM 700.

Referring now to FIG. 8, a flowchart of a method for assigning addresses to battery pack modules is shown. At 802, routine 800 initializes the module programming by clearing module addresses. Clearing the module addresses also interrupts the transmission of signals via the communication link for providing notice to limit degradation within the battery pack. A command is also issued over a CAN link to the battery modules to deactivate the heartbeat signal during the programming sequence. Routine 800 proceeds to 804 after programming is initialized.

At 804, routine 800 judges whether or not an address has been assigned to the present module. In one example, the BCM sends out a first address over a CAN link after module initialization. After a module accepts the address the module transmits an address set acknowledgment over the CAN to the BCM so that the BCM can increment the module addresses. If a module address has been accepted by a module routine 800 proceeds to 808. Otherwise, routine 800 proceeds to 810.

At 808, routine 800 judges whether or not all modules of the battery pack have been assigned an address. In one example, the BCM compares an internal count variable to a variable in a module configuration file to determine if all modules have been assigned. Routine 800 proceeds to exit if all modules have been assigned an address. Otherwise, routine 800 proceeds to 814.

At 814, routine 800 increments an internal variable in the BCM to keep track of assigned module addresses. For each module that accepts an address the internal variable is incremented. Routine 800 returns to 804 after the module address is incremented.

At 810, routine 800 sends an assigned module addresses to a module. The BCM does not know which module in the daisy-chained communication (e.g., see FIG. 4 at 480) link should receive an address. The BCM simply knows the number of addresses to assign based on a configuration file. The module address number is determined by the position of the module in the daisy-chain. To ensure that each module is assigned a unique address a module can only accept an address assignment when the daisy-chain input to the module is pulled low (e.g., ground) and when the module has not been assigned an address. Thus, when the BCM broadcasts an address assignment on the CAN link, the only module that can accept the address is a module that does not have an assigned address and that is positioned after the last module to accept an address. The module to receive and accept the broadcast address has to be positioned after the prior module to accept an address because the prior module to accept an address sets the optical input of a subsequent module to a low state after an address has been accepted. In this way, each module receives a unique address at least partially in response to the state of the daisy-chain communication link that provides notice to limit degradation within the battery pack. Routine 800 proceeds to 812 after the BCM or another module at the end of the daisy-chain communication link broadcasts a module address. It should be noted that addresses will not be assigned to all modules if there is an indication of degradation along the length of the communication link (e.g., if CELL_THRESHOLD is asserted).

At 812, routine 800 activates the daisy-chain communication link output of the module that most recently accepted a BCM broadcast address. In one example, an optical coupler output is closed so that the input of the following module in the daisy-chain communication link for providing notice to limit battery pack degradation of the subsequent module is asserted low. This action activates an input optical coupler of a subsequent module in the daisy-chain communication link to prepare the subsequent module to receive the next address broadcast by the BCM.

Thus, the method of FIG. 8 provides for a method for addressing modules of a battery pack, comprising: accepting an address assignment for a battery pack electronic module in response to an absence of an address at the battery pack module, a first signal from a first communication link at said battery pack module, and an address assignment broadcast on a second communication link. The method also includes where the first signal is a signal indicating no notice of a request to limit battery pack degradation at a previous batter pack electronic module, and wherein the first communication link is a daisy-chained communication link. The method also includes further asserting an output indicating no notice of a request to limit battery pack degradation after accepting said address assignment. In one example, method includes where the second communication link is a CAN link and wherein said address assignment broadcast on said second communication link is broadcast via a BCM.

Figure 9:
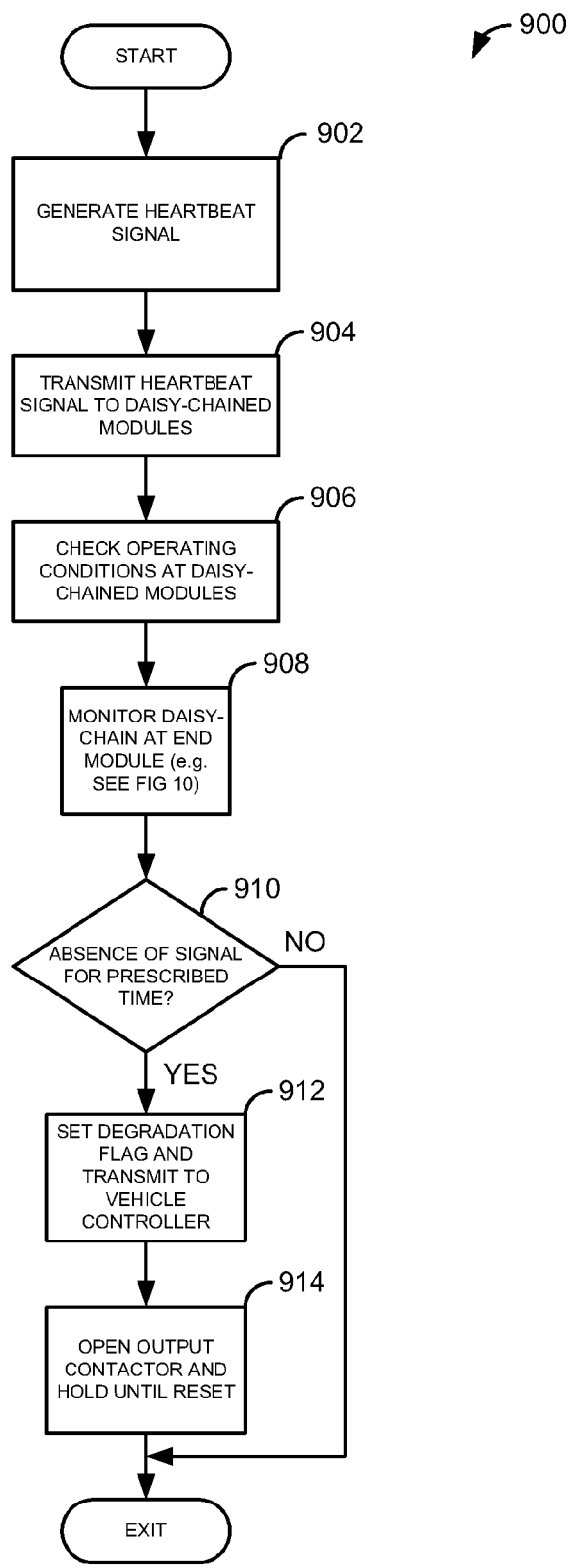
FIG. 9 shows a flowchart of a method for providing notice to limit battery pack degradation by way of a communication link.

Referring now to FIG. 9, a flowchart of a method for providing notice to limit battery pack degradation by way of a communication link (e.g., see FIG. 4 at 480). At 902, routine 900 starts to generate a heartbeat signal at the first module in the daisy-chain communication link. In one example, the heartbeat signal is generated by toggling an output of a microcontroller that can activate and deactivate an optical coupler in the daisy-chain communication link. The heartbeat signal may be generated at a frequency and duty cycle appropriate for the application (e.g., a 1 Hz period with 100 ms high state). Routine 900 proceeds to 904 after the heartbeat signal is activated.

At 904, routine 900 transmits the heartbeat signal. In one example, routine 900 transmits the heartbeat signal by driving an optical coupler on and off. By driving the optical coupler on and off, the states of subsequent optical couplers in other modules in the daisy-chain communication link are also switched. In this way, the signal generated at the first module in the daisy-chain communication link causes the signal to cascade from module to module.

At 906, routine 900 checks operating conditions at each module to determine if notice to limit battery pack degradation should be provided. Routine may evaluate conditions such as but not limited to battery cell voltage, battery module current, battery module voltage, battery cell temperature, battery output contactor temperature, battery pack voltage, battery pack current, and bus voltage isolation detection. Routine 900 sets an optical coupler of an appropriated module to an inactive state if one these conditions are determined. Routine 900 proceeds to 908 after conditions of degradation have been checked.

At 908, routine 900 monitors a state of an optical coupler input of the last module in the daisy-chain communication link for providing notice to limit battery pack degradation. If the optical input does not change state in a predetermined amount of time after the heartbeat signal is activated, routine 900 determines that notice to limit battery pack degradation is present. Routine 900 proceeds to 910 after monitoring the daisy-chain communication link input of the last module in the daisy-chain.

At 910, routine judges whether or not there is an absence of a heartbeat signal. In one example, routine 900 judges an absence of a heartbeat signal if the state of an optical isolator does not change in a prescribed amount of time. Routine 900 proceeds to 912 when it is judged that there is an absence of a heartbeat signal. Otherwise, routine 900 proceeds to exit.

At 912, routine 900 sets an internal flag to limit battery pack degradation. The BCM broadcasts a signal to a vehicle controller or a system controller (e.g., stationary power controller) when the flag is set. In this way, the BCM can provide notice to external systems that the BCM is taking actions to limit battery pack degradation. Routine 900 proceeds to 914 after the flag is set and after the message indicating limiting of battery pack degradation is sent.

At 914, routine 900 takes actions to limit battery pack degradation. In one example, routine 900 send a signal to open a battery pack output contactor. Further, routine 900 can hold the output contactors in an open state until the heartbeat signal is received and a predetermined control sequence is determined. For example, once the battery output contactor is opened, routine 900 can keep the output contactor open until the heartbeat signal is detected and until a contactor opening signal from an external controller is detected. Routine 900 exits after taking actions to limit battery pack degradation.

Figure 10:
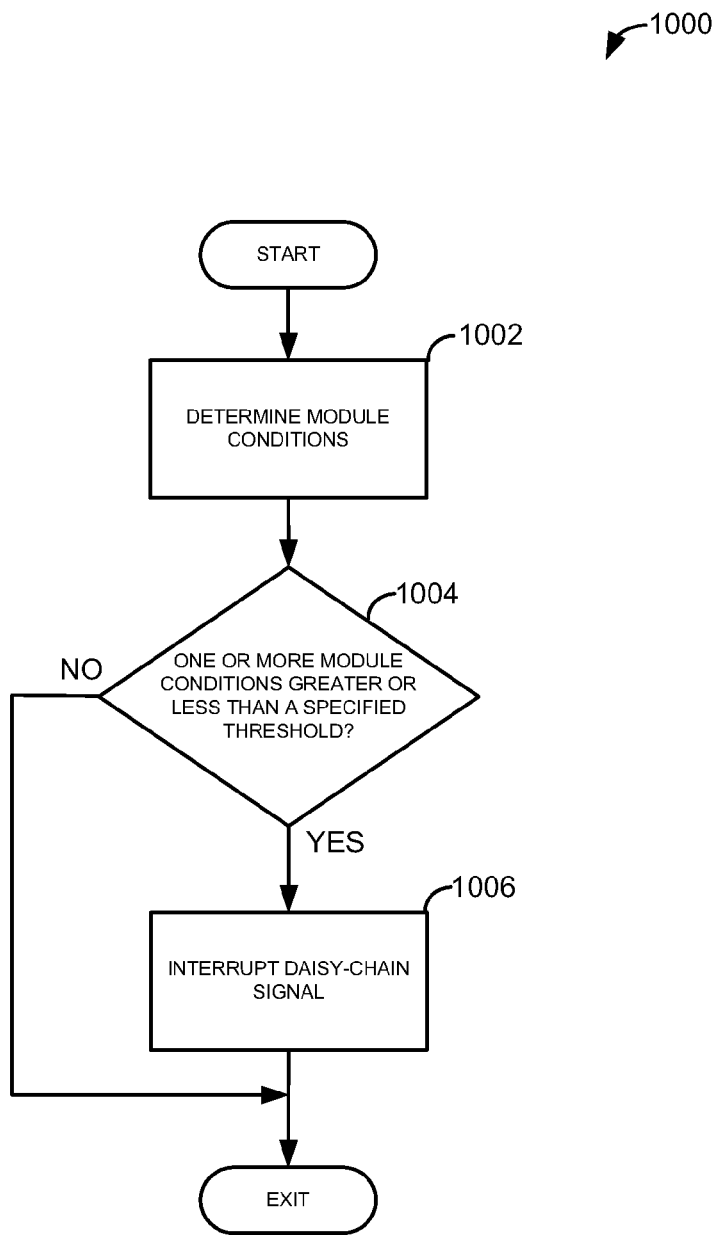
FIG. 10 shows a flowchart of a method for providing an indication to limit battery degradation.

Referring now to FIG. 10, a routine for providing an indication to limit battery degradation is shown. At 1002, routine 1000 determines module conditions. Module conditions may included but are not limited to battery cell voltage, battery module current, battery module voltage, battery cell temperature, battery output contactor temperature, battery pack voltage, battery pack current, and bus voltage isolation detection. Routine 1000 proceeds to 1004 after operating conditions are determined.

At 1004, routine 1000 judges whether or not one or more module conditions are greater or less than a specified threshold. For example, if a battery cell voltage is less than a first threshold level or greater than a second threshold level, routine 1000 proceeds to 1006. In one example, hardware circuitry in the modules provides a redundant voltage check that backs-up software which monitors and controls battery cell voltage. Similar tests may be applied to other module conditions such as those described at 1002. If all module operating conditions are within a desirable range, routine 1000 proceeds to exit.

At 1006, routine 1000 interrupts a signal generated by the first module in the daisy-chain communication link for providing notice to limit degradation within the battery pack. In one example, a module output comprising an optical coupler is set to a floating state so that a pull-up resistor at an input of a subsequent module holds the input at a high state relative to the low voltage bus. In this way, the signal generated by the first module in the communication link is interrupted. In other examples, other switches such as FETs may be used to interrupt the signal. By interrupting the signal, inputs of subsequent modules in the daisy-chain sequence can be held in a prescribed state so that the end module in the daisy-chain communication link does not detect the heartbeat signal. Routine 1000 exits after the daisy-chain heartbeat signal has been interrupted.

Thus, the methods of FIGS. 9-10 provide for a method for providing notice to limit degradation within a battery pack, comprising: coupling a plurality of battery pack electronic modules via a communication link; generating a signal in a first battery pack electronic module, the first battery pack electronic module at a first end of the communication link; transmitting the signal via the communication link; and opening a battery output contactor in response to an absence of the signal at a second battery pack electronic module at a second end of the communication link. The method includes where the battery output contactor is opened a predetermined amount of time after the absence of the signal, and wherein the communication link couples the plurality of battery pack electronic modules in a daisy-chain configuration. The method includes where the signal is a series of pulses output at a predetermined timing. In one example the method includes where the first battery pack electronic module is a battery current sensing module, and wherein the second battery pack electronic module is a battery control module, and wherein at least one MBB is located between the first battery pack electronic module and the second battery pack electronic module. The method also includes where at least one of the plurality of battery pack electronic modules is assigned an address for communicating with the second battery pack module according to a position of the at least one of the plurality of battery pack electronic modules in the daisy-chain configuration. The method also includes where the communication link is comprised of a single electrical conductor. The method also includes where said communication link is at least partially isolated via optical couplers from said a plurality of battery pack electronic modules.

The subject matter of the present disclosure includes all novel and nonobvious combinations and subcombinations of the various systems and configurations, and other features, functions, and/or properties disclosed herein.

As will be appreciated by one of ordinary skill in the art, routines described in FIGS. 8-10 may be represented by instructions for a controller and may be represented by one or more of any number of processing strategies such as event-driven, interrupt-driven, multi-tasking, multi-threading, and the like. As such, various steps or functions illustrated may be performed in the sequence illustrated, in parallel, or in some cases omitted. Likewise, the order of processing is not necessarily required to achieve the objects, features, and advantages described herein, but is provided for ease of illustration and description. Although not explicitly illustrated, one of ordinary skill in the art will recognize that one or more of the illustrated steps or functions may be repeatedly performed depending on the particular strategy being used.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method for providing notice to limit degradation within a battery pack, comprising:
coupling a plurality of battery pack electronic modules via a communication link;

generating a signal in a first battery pack electronic module, the first battery pack electronic module at a first end of the communication link;
transmitting the signal via the communication link; and
opening a battery output contactor electrically coupling a plurality of battery pack battery cell stacks to a load external to the battery pack in response to an absence of the signal at a second battery pack electronic module at a second end of the communication link.

2. The method of claim 1, wherein the battery output contactor is opened a predetermined amount of time after the absence of the signal, and wherein the communication link couples the plurality of battery pack electronic modules in a daisy-chain configuration.

3. The method of claim 1, wherein the signal is a series of pulses output at a predetermined timing, where the communication link is a first communication link, and further comprising assigning addresses to the plurality of battery pack electronic modules via a second communication link and the first communication link.

4. The method of claim 1, wherein the first battery pack electronic module is a battery current sensing module, and wherein the second battery pack electronic module is a battery control module, and wherein at least one monitoring and balancing board (MBB) is located between the first battery pack electronic module and the second battery pack electronic module.

5. The method of claim 1, wherein at least one of the plurality of battery pack electronic modules is assigned an address for communicating with the second battery pack module according to a position of the at least one of the plurality of battery pack electronic modules in the daisy-chain configuration.

6. The method of claim 1, wherein the communication link is comprised of a single electrical conductor, where the battery output contactor is electrically coupled to a positive battery pack voltage, and further comprising a second battery output contactor electrically coupled to a negative battery pack voltage and the load external to the battery pack, the second battery output contactor opened in response to the absence of the signal at the second battery pack electronic module.

7. The method of claim 1, wherein said communication link is at least partially isolated via optical couplers from said plurality of battery pack electronic modules.

8. A system for providing notice to limit degradation within a battery pack, comprising:
a first module of a plurality of electronic modules in a battery pack, the first module including a signal generator configured to generate a signal;
a second module of the plurality of electronic modules in the battery pack, the second module configured to monitor at least one battery cell, the second module further configured to pass and interrupt the signal;
a third module of the plurality of electronic modules in the battery pack, the third module including a signal receiver, the signal receiver configured to receive the signal, the third module further including an output for controlling an output contactor of the battery pack, the output contactor controlling current from a plurality of battery cell stacks to a load external to the battery pack.

9. The system of claim 8, wherein the second module is configured to interrupt the signal during a condition of degradation recognized by the second module, and wherein the third module of the plurality of electronic modules includes hardware circuitry for controlling the output contactor.

10. The system of claim 8, wherein the second module is configured to pass the signal during an absence of a condition of degradation recognized by the second module, and further comprising a first communication link for transmitting the signal from the first module to the second module and a second communication link for assigning an address to the second module in conjunction with the first communications link.

11. The system of claim 8, wherein the third module includes a controller having instructions for assigning addresses to modules in the plurality of electronic modules.

12. The system of claim 8, wherein the third module is a battery pack controller module configured to communicate a condition of battery pack degradation to a controller external to the battery pack when the signal is interrupted by the second module of the plurality of electronic modules in the battery pack.

13. The system of claim 8, wherein the first module, the second module, and the third module are in communication via a daisy-chained communication link.

14. The system of claim 13, wherein the daisy-chained communication link is in communication with a low voltage bus in the battery pack.

15. A system for providing notice to limit degradation within a battery pack, comprising:
a signal generator configured to generate a signal;
a first circuit for detecting a threshold condition of a battery pack, the first circuit also configured to pass and interrupt the signal; and
a second circuit, the second circuit configured to open an output contactor of the battery pack in response to an absence of the signal at the second circuit for more than a predetermined amount of time, the output contactor electrically coupling a plurality of battery pack battery cell stacks to a load external to the battery pack.

16. The system of claim 15, wherein the signal generator is coupled to the second circuit via a first communication link, and wherein the system further includes a controller for communicating a request to limit battery pack degradation to a controller external the battery pack, and further comprising a second communication link for assigning an address to a battery module in conjunction with the first communication link.

17. The system of claim 16, wherein the first circuit is one of a plurality of circuits for detecting the threshold condition of a plurality of electronic modules, and wherein the first communication link is arranged in a daisy-chain configuration between the plurality of electronic modules.

18. The system of claim 17, wherein the controller includes further instructions for assigning addresses to the plurality of electronic modules.

19. The system of claim 18, wherein each of said plurality of electronic modules is assigned a unique address.

20. The system of claim 18, wherein the assigning of addresses is carried out at one address at a time for the plurality of electronic modules.

* * * * *